United States Patent
Wang et al.

(10) Patent No.: US 7,576,588 B2
(45) Date of Patent: Aug. 18, 2009

(54) QUICK TURN ON APPARATUS AND METHOD FOR A NMOSFET SWITCH

(75) Inventors: Ko-Cheng Wang, Puli Township, Nantou County (TW); Liang-Pin Tai, Tainan (TW)

(73) Assignee: Richtek Technology Corp., Hsinchu (TW)

( * ) Notice: Subject to any disclaimer, the term of this patent is extended or adjusted under 35 U.S.C. 154(b) by 83 days.

(21) Appl. No.: 11/498,240

(22) Filed: Aug. 3, 2006

(65) Prior Publication Data

US 2007/0046358 A1 Mar. 1, 2007

(30) Foreign Application Priority Data

Aug. 24, 2005 (TW) .............................. 94128959 A

(51) Int. Cl.
*H03K 17/687* (2006.01)
*H03K 17/04* (2006.01)
*G11C 5/14* (2006.01)

(52) U.S. Cl. ........................ 327/427; 327/376; 327/530

(58) Field of Classification Search ................. 327/170, 327/530, 536, 543, 365, 374, 376, 387, 427; 363/20, 21
See application file for complete search history.

(56) References Cited

U.S. PATENT DOCUMENTS

| 7,046,079 B2 * | 5/2006 | Van Blerkom et al. ...... 327/543 |
| 7,378,898 B2 * | 5/2008 | Nair ........................... 327/427 |
| 2004/0246044 A1 * | 12/2004 | Myono et al. ............... 327/536 |
| 2005/0189965 A1 * | 9/2005 | Tihanyi ....................... 327/108 |

* cited by examiner

*Primary Examiner*—Lincoln Donovan
*Assistant Examiner*—Colleen O'Toole
(74) *Attorney, Agent, or Firm*—Rosenberg, Klein & Lee

(57) ABSTRACT

A quick turn on apparatus and method for a NMOSFET switch are used to maintain the gate voltage of the NMOSFET switch non-zero but not enough to turn on the NMOSFET switch, such that the NMOSFET switch turns on more quickly when it is to be turned on. Seamless transition can be further achieved in a single pole double throw switching circuit by using the quick turn on apparatus and method.

12 Claims, 6 Drawing Sheets

QUICK TURN ON APPARATUS AND METHOD FOR A NMOSFET SWITCH

FIELD OF THE INVENTION

The present invention is related generally to a quick turn on apparatus and method for a NMOSFET switch.

BACKGROUND OF THE INVENTION

As shown in FIG. 1, a power supply circuit 10 comprises a NMOSFET switch M1 as a power switch coupled between an input voltage VIN and an output VOUT. When charge pump 12 pulls high the gate voltage of the NMOSFET switch M1 over a threshold, the NMOSFET switch M1 turns on and thereby the input voltage VIN is coupled to the output VOUT. When the charge pump 12 stops working, and hence the gate voltage of the NMOSFET switch M1 drops down to be lower than the threshold, the NMOSFET switch M1 turns off, thereby disconnecting the input voltage VIN from the output VOUT. However, the charge pump 12 pulls high the gate voltage of the NMOSFET switch M1 from zero to the threshold requires a response time, which degrades the switching speed of the NMOSFET switch M1 and hence the operation speed of the power supply circuit 10.

Therefore, it is desired a quick turn on apparatus and method for a NMOSFET switch.

SUMMARY OF THE INVENTION

An object of the present invention is to provide a quick turn on apparatus and method to speed up a NMOSFET switch to turn on.

Another object of the present invention is to provide a switching circuit with seamless transition.

According to the present invention, a quick turn on apparatus and method for a NMOSFET switch are used to maintain the gate voltage of the NMOSFET switch non-zero but not enough to turn on the NMOSFET switch, such that the NMOSFET switch turns on more quickly when it is to be turned on.

According to the present invention, a switching circuit comprises a first NMOSFET switch coupled between a first input and an output, a second NMOSFET switch coupled between a second input and the output, a first quick turn on apparatus coupled to a gate of the first NMOSFET switch, and a second quick turn on apparatus coupled to a gate of the second NMOSFET switch. During the first NMOSFET switch is off, the first quick turn on apparatus maintains the gate voltage of the first NMOSFET switch at a first non-zero level but not enough to turn on the first NMOSFET switch, such that the first NMOSFET switch turns on more quickly due to the gate voltage of the first NMOSFET switch rising up from the first non-zero level when it is to be turned on. Likewise, during the second NMOSFET switch is off, the second quick turn on apparatus maintains the gate voltage of the second NMOSFET switch at a second non-zero level but not enough to turn on the second NMOSFET switch, such that the second NMOSFET switch turns on more quickly due to the gate voltage of the second NMOSFET switch rising up from the second non-zero level when it is to be turned on.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
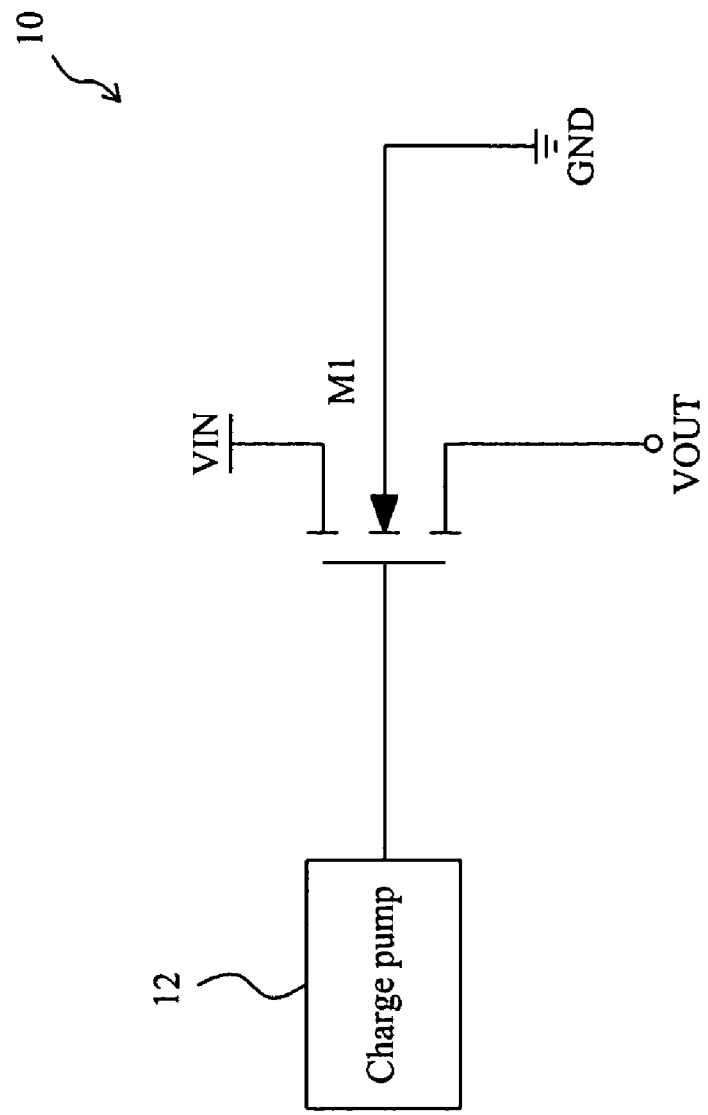
FIG. 1 shows a conventional power supply circuit having a NMOSFET switch as a power switch.
Figure 2:
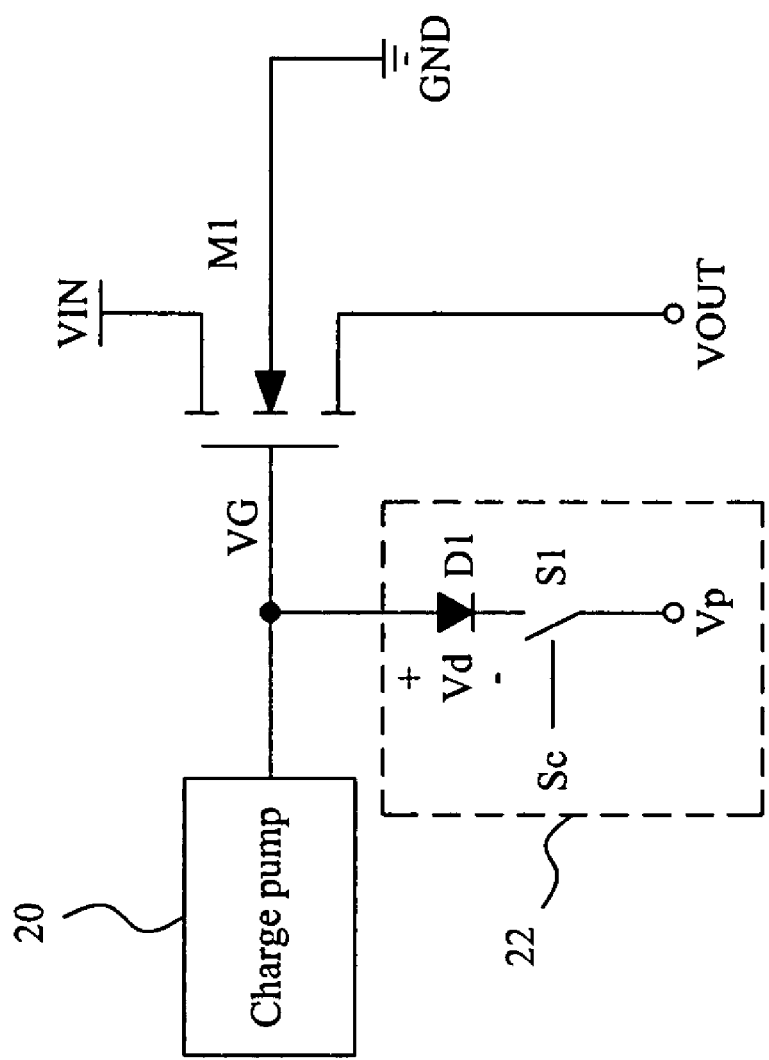
FIG. 2 shows a first embodiment of a power supply circuit according to the present invention.

FIG. 2 shows a first embodiment of a power supply circuit according to the present invention, in which NMOSFET switch M1 has a drain coupled to input VIN and a source coupled to output VOUT, charge pump 20 is coupled to the gate of the NMOSFET switch M1, and quick turn on apparatus 22 is also coupled to the gate of the NMOSFET switch M1 for turning on the NMOSFET switch M1 more quickly. The quick turn on apparatus 22 comprises switch S1 and diode D1 coupled in series between the gate of the NMOSFET switch M1 and voltage Vp, and the switch S1 is controlled by control signal Sc. During the NMOSFET switch M1 is off, the switch S1 is on, such that the gate voltage VG of the NMOSFET switch M1 is not zero, but equal to the summation of the voltage Vp and the forward bias voltage Vd of the diode D1, i.e., VG=Vp+Vd. However, this gate voltage VG is not high enough to turn on the NMOSFET switch M1. To turn on the NMOSFET switch M1, the switch S1 is turned off by the control signal Sc, and the charge pump 20 pumps the gate voltage VG of the NMOSFET switch M1 from Vp+Vd until the NMOSFET switch M1 is completely turned on. Because of saving the time for the gate voltage VG to rise up from zero to Vp+Vd, it speeds up the NMOSFET switch M1 to turn on. Only that the resultant gate voltage VG will not turn on the NMOSFET switch M1 during the NMOSFET switch M1 is off, the voltage Vp may be selected to have any one, for example the output voltage VOUT by connecting the node Vp to the output VOUT.

Figure 3:
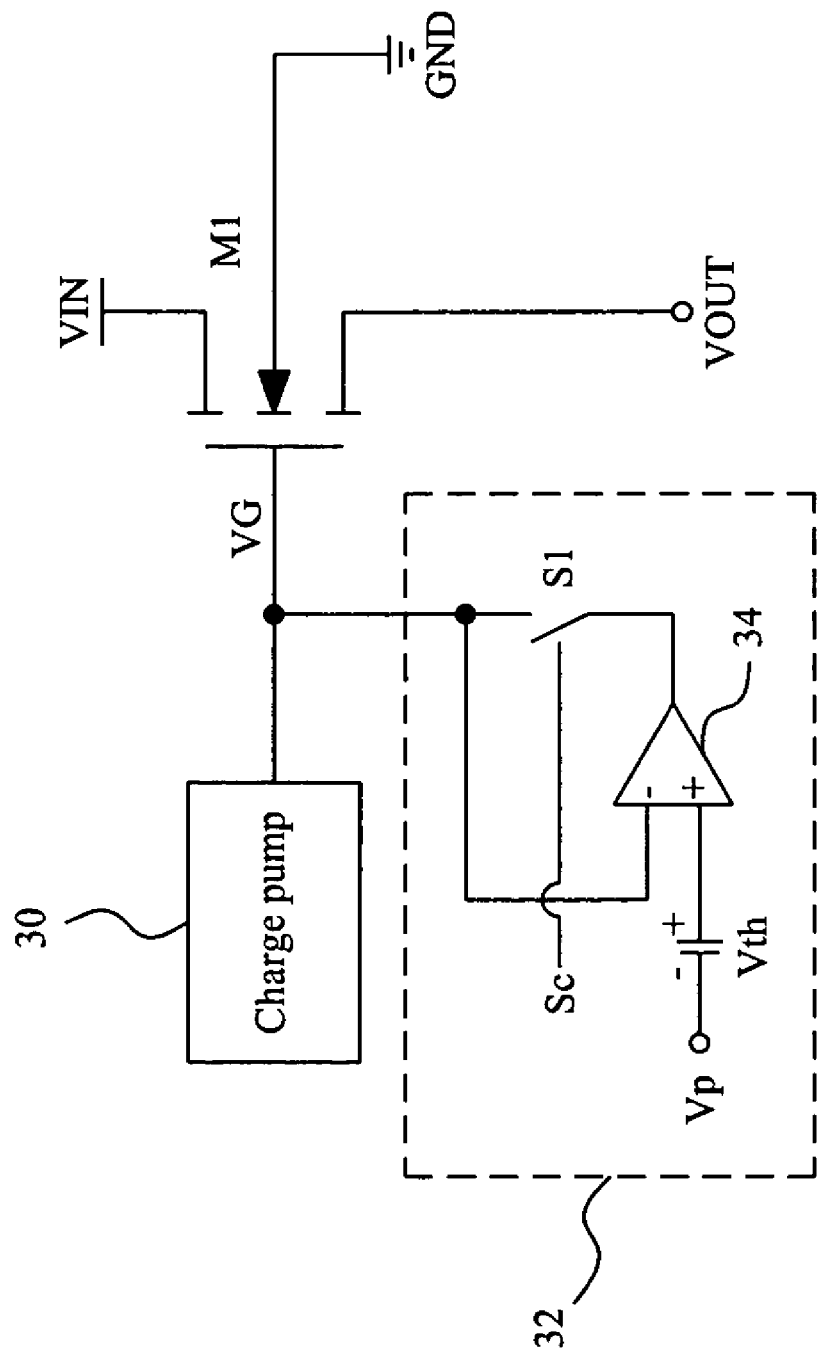
FIG. 3 shows a second embodiment of a power supply circuit according to the present invention.

Alternatively, as shown in FIG. 3, quick turn on apparatus 32 comprises operational amplifier 34 having its non-inverting input coupled to voltage Vp with voltage source Vth therebetween, and inverting input coupled to the gate of the NMOSFET switch M1, and switch S1 coupled between the gate of the NMOSFET switch M1 and the output of the operational amplifier 34. The switch S1 is still controlled by the control signal Sc. During the NMOSFET switch M1 is off, the switch S1 is on, and the operational amplifier 34 works as a voltage follower, such that the gate voltage VG of the NMOSFET switch M1 is equal to the summation of the voltages Vp and Vth, i.e., VG=Vp+Vth, but not enough to turn on the NMOSFET switch M1. To turn on the NMOSFET switch M1, the switch S1 is turned off by the control signal Sc, and the charge pump 30 pumps the gate voltage VG from the level of Vp+Vth until the NMOSFET switch M1 is completely turned on. Again, since the time for the gate voltage VG rises up from zero to Vp+Vth is not required, the NMOSFET switch M1 will turn on more quickly. As in the first embodiment, only that the resultant gate voltage VG will not turn on the NMOSFET switch M1 during the NMOSFET switch M1 is off, the voltage Vp may be selected to have any one, for example the output voltage VOUT by connecting the node Vp to the output VOUT.

Figure 4:
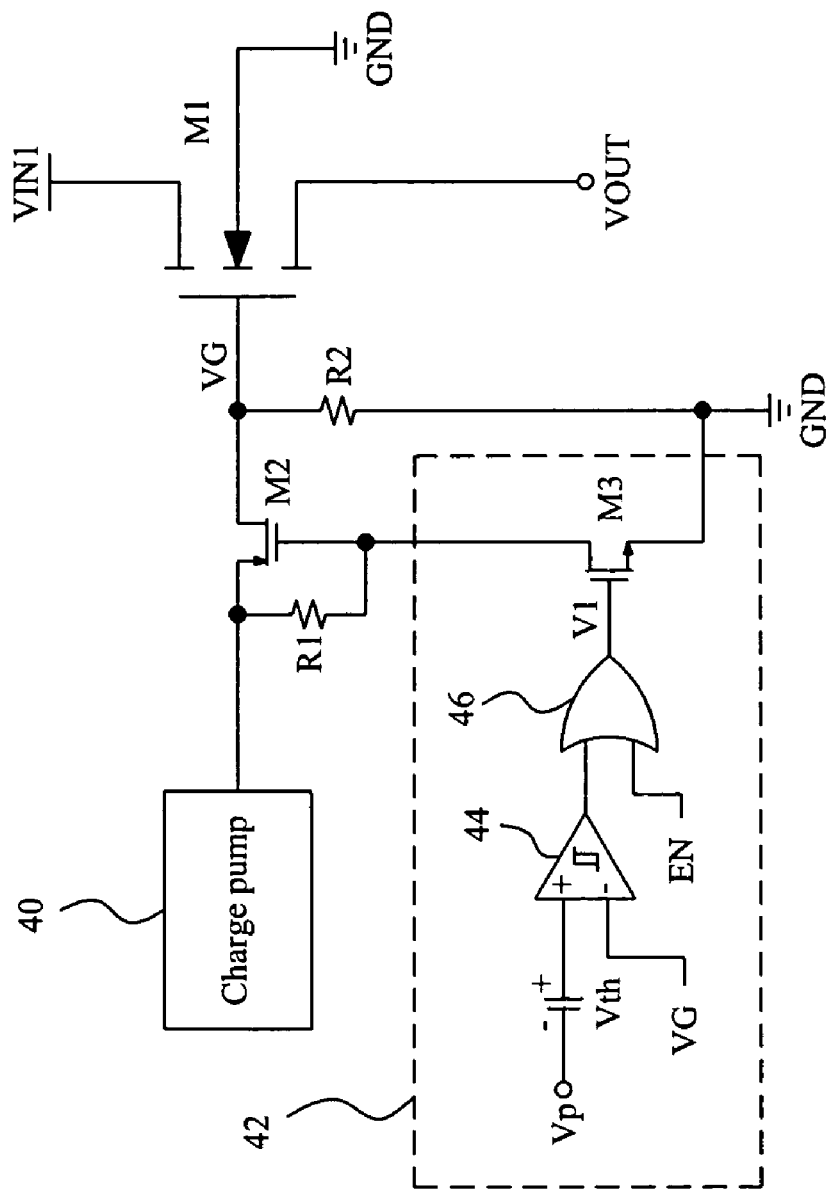
FIG. 4 shows a third embodiment of a power supply circuit according to the present invention.

FIG. 4 shows a third embodiment of a power supply circuit according to the present invention, in which NMOSFET switch M1 has a drain coupled to input VIN and a source coupled to output VOUT, charge pump 40 is coupled to the gate of the NMOSFET switch M1 through PMOS transistor M2, and quick turn on apparatus 42 is coupled to the gate of the PMOS transistor M2 for switching the PMOS transistor M2. In the quick turn on apparatus 42, hysteresis comparator 44 monitors the gate voltage VG of the NMOSFET switch M1 in such a manner that, if the gate voltage VG is detected to be lower than the level of Vp+Vth during the NMOSFET switch M1 is off, the output of the hysteresis comparator 44 will signal OR gate 46 to produce signal V1 to turn on NMOS transistor M3, causing the PMOS transistor M2 turning on, such that the gate of the NMOSFET switch M1 is charged by the charge pump 40. Once the gate voltage VG reaches the level Vp+Vth, the NMOS transistor M3 is turned off by the signal V1, and hence the PMOS transistor M2 is turned off too, so that the gate of the NMOSFET switch M1 stops being charged and is maintained at the level Vp+Vth, which is not high enough to turn on the NMOSFET switch M1. To turn on the NMOSFET switch M1, the NMOS transistor M3 is turned on by enable signal EN signaling the OR gate 46, and the PMOS transistor M2 is turned on accordingly, for the charge pump 40 to pump the gate voltage VG from the level Vp+Vth to completely turn on the NMOSFET switch M1. Because of saving the time to rise up the gate voltage VG from zero to the level Vp+Vth, the NMOSFET switch M1 is turned on more quickly. During the NMOSFET switch M1 is on, the enable signal EN maintains at high level for the NMOS transistor M3 and thereby the PMOS transistor M2 always at on state. Only that the resultant gate voltage VG will not reach the threshold voltage to turn on the NMOSFET switch M1 during the NMOSFET switch M1 is off, the voltage Vp may be selected to have any one, for example the output voltage VOUT by connecting the node Vp to the output VOUT.

Figure 5:
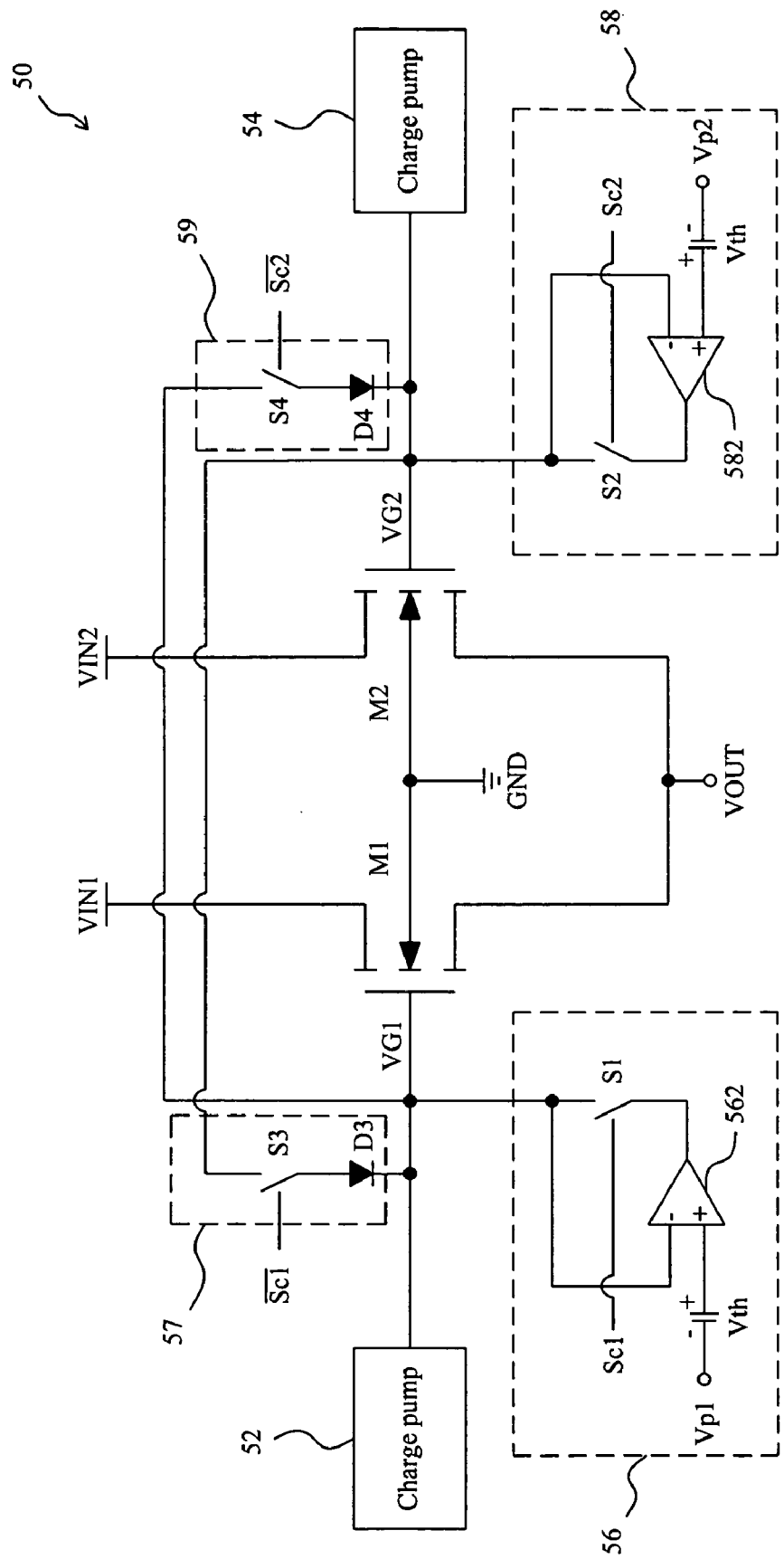
FIG. 5 shows a first embodiment of a switching circuit according to the present invention.

FIG. 5 shows a power multiplexer or single pole double throw switching circuit 50 according to the present invention, in which NMOSFET switch M1 is coupled between input VIN1 and output VOUT, NMOSFET switch M2 is coupled between input VIN2 and the output VOUT, and two charge pumps 52 and 54 are provided to turn on the NMOSFET switches M1 and M2, respectively. To speed up the NMOSFET switch M1 to turn on, quick turn on apparatus composed of two blocks 56 and 57 is provided, in which the block 56 includes operational amplifier 562 having its non-inverting input coupled to voltage Vp1 with voltage source Vth therebetween, and inverting input coupled to the gate of the NMOSFET switch M1, and switch S1 coupled between the gate of the NMOSFET switch M1 and the output of the operational amplifier 562, and the block 57 includes switch S3 and diode D3 coupled in series between the gate of the NMOSFET switch M1 and the gate of the NMOSFET switch M2. The switches S1 and S3 are controlled by a pair of complementary control signals Sc1 and $\overline{Sc1}$, respectively. To speed up the NMOSFET switch M2 to turn on, similarly, quick turn on apparatus composed of two blocks 58 and 59 is provided, in which the block 58 includes operational amplifier 582 having its non-inverting input coupled to voltage Vp2 with voltage source Vth therebetween, and inverting input coupled to the gate of the NMOSFET switch M2, and switch S2 coupled between the gate of the NMOSFET switch M2 and the output of the operational amplifier 582, and the block 59 includes switch S4 and diode D4 coupled in series between the gate of the NMOSFET switch M2 and the gate of the NMOSFET switch M1. The switches S2 and S4 are controlled by a pair of complementary control signals Sc2 and $\overline{Sc2}$, respectively. In other embodiments, however, it may only use either the blocks 56 and 58 or the blocks 57 and 59 for serving as the two quick turn on apparatus for the NMOSFET switches M1 and M2, respectively.

In this embodiment, it is the quick turn on apparatus 32 shown in FIG. 3 used to maintain the gate voltages of the NMOSFET switches M1 and M2 non-zero during the NMOSFET switches M1 and M2 are off, while in other embodiments, it may employ the quick turn on apparatus 22 shown in FIG. 2 instead. Only that the resultant gate voltage VG1/VG2 will not reach the threshold voltage to turn on the NMOSFET switch M1/M2 during the NMOSFET switch M1/M2 is off, the voltage Vp1/Vp2 may be selected to have any one, for example the output voltage VOUT by connecting the node Vp1/Vp2 to the output VOUT, or the lowest one of the input voltages VIN1 and VIN2 and the output voltage VOUT by connecting the node Vp1/Vp2 to the corresponding node thereof.

With reference to FIG. 5, when the NMOSFET switch M1 turns off and the NMOSFET switch M2 turns on, the output voltage VOUT is equal to the input voltage VIN2. In this case, the switches S1 and S4 are on, and the switches S2 and S3 are off, such that the operational amplifier 562 works as a voltage follower, thereby the gate voltage VG1 of the NMOSFET switch M1 equal to Vp1+Vth, but not high enough to turn on the NMOSFET switch M1. To turn on the NMOSFET switch M1 and turn off the NMOSFET switch M2, the switches S1 and S4 are turned off, the switches S2 and S3 are turned on, and the charge pump 52 pumps the gate voltage VG1 of the NMOSFET switch M1 from the level Vp1+Vth until the NMOSFET switch M1 is completely turned on. In this embodiment, in addition to save the time to rise up the gate voltage VG1 from zero to Vp1+Vth, and it also shares charges on the gate of the NMOSFET switch M2 to the gate of the NMOSFET switch M1 through the switch S3 and the diode D3. As a result, it more further speeds up the NMOSFET switch M1 to turn on. Since the switch S2 turns on, the operational amplifier 582 becomes a voltage follower, thereby maintaining the gate voltage VG2 of the NMOSFET switch M2 at the level Vp2+Vth but not enough to turn on the NMOSFET switch M2. In the next time to turn on the NMOSFET switch M2, the gate voltage VG2 of the NMOSFET switch M2 is pulled up from the level Vp2+Vth, such that the time to pump the gate voltage VG2 from zero to the level Vp2+Vth is saved, and the gate of the NMOSFET switch M1 will share the chares thereon with the gate of the NMOSFET switch M2 through the switch S4 and the diode D4, thereby turning on the NMOSFET switch M2 much faster.

Figure 6:
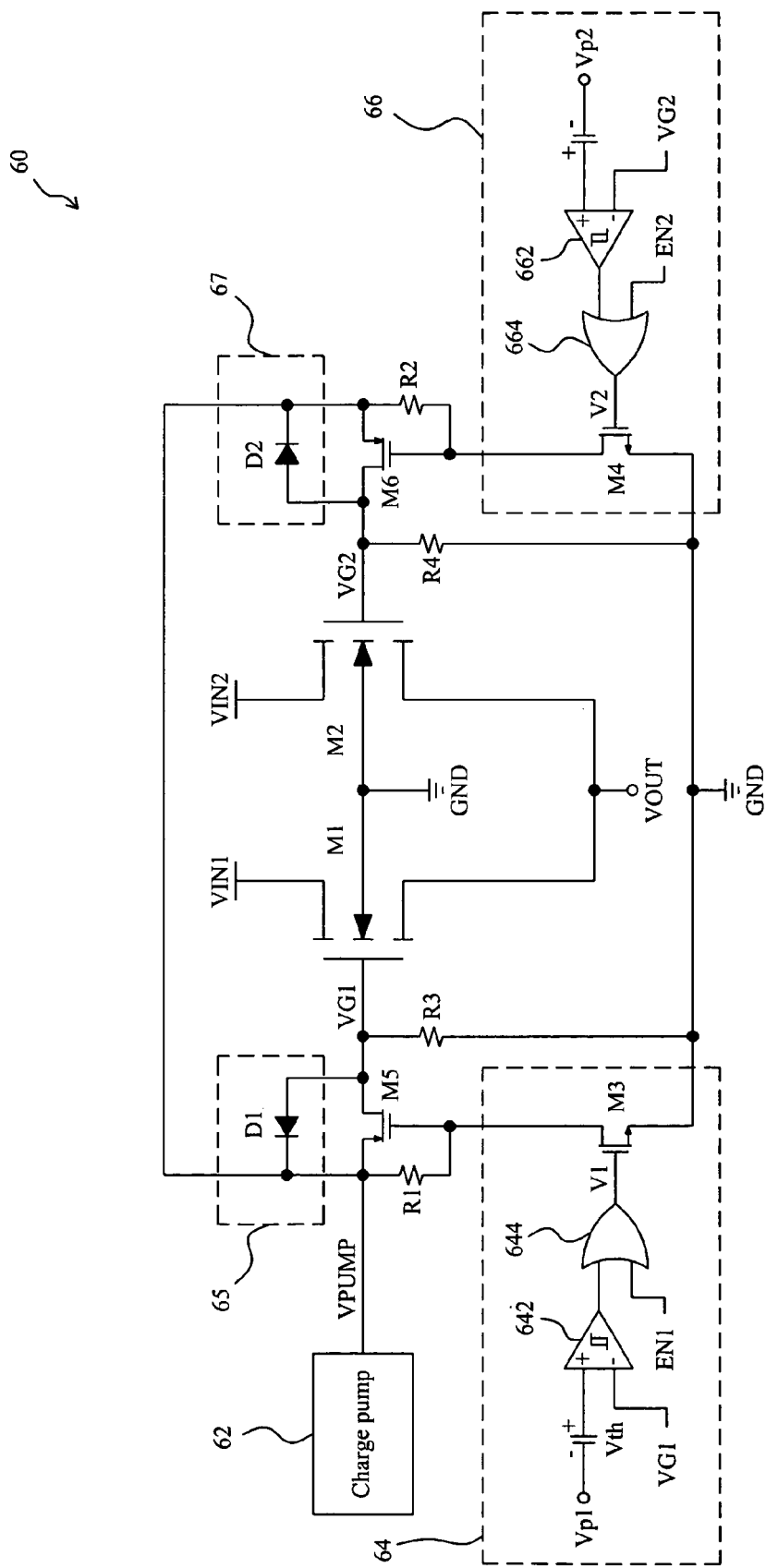
FIG. 6 shows a second embodiment of a switching circuit according to the present invention.

FIG. 6 shows another single pole double throw switching circuit 60 according to the present invention, which also comprises NMOSFET switches M1 and M2 coupled between inputs VIN1 and VIN2 and output VOUT, respectively. However, both the NMOSFET switches M1 and M2 use common charge pump 62 in such a manner that, PMOS transistor M5 is coupled between the charge pump 62 and the gate of the NMOSFET switch M1, and PMOS transistor M6 is coupled between the charge pump 62 and the gate of the NMOSFET switch M2. Quick turn on apparatus for the NMOSFET switch M1 includes two blocks 64 and 67, in which the block 64 comprises hysteresis comparator 642 having its non-inverting input coupled to voltage Vp1 with voltage source Vth therebetween, and inverting input coupled to the gate of the NMOSFET switch M1, NMOS transistor M3 coupled between the gate of the PMOS transistor M5 and ground GND, and OR gate 644 to produce signal V1 to switch the NMOS transistor M3 according to the comparison output of the hysteresis comparator 642 and an enable signal EN1, and the block 67 comprises diode D2 coupled between the gate of the NMOSFET switch M2 and the PMOS transistor M5. Preferably, the diode D2 is the parasitic diode of the PMOS transistor M6. Quick turn on apparatus for the NMOSFET switch M2 includes two blocks 66 and 65, in which the block 66 comprises hysteresis comparator 662 having its non-inverting input coupled to voltage Vp2 with voltage source Vth therebetween, and inverting input coupled to the gate of the NMOSFET switch M2, NMOS transistor M4 coupled between the gate of the PMOS transistor M6 and ground GND, and OR gate 664 to produce signal V2 to switch the NMOS transistor M4 according to the comparison output of the hysteresis comparator 662 and an enable signal EN2, and the block 65 comprises diode D1 coupled between the gate of the NMOSFET switch M1 and the PMOS transistor M6. Preferably, the diode D1 is the parasitic diode of the PMOS transistor M5. Only that the resultant gate voltage VG1/VG2 will not reach the threshold voltage to turn on the NMOSFET switch M1/M2 during the NMOSFET switch M1/M2 is off, the voltage Vp1/Vp2 may be selected to have any one, for example the output voltage VOUT by connecting the node Vp1/Vp2 to the output VOUT, or the lowest one of the input voltages VIN1 and VIN2 and the output voltage VOUT by connecting the node Vp1/Vp2 to the corresponding node thereof. During the NMOSFET switch M1 is on, the enable signal EN1 maintains at high level for the NMOS transistor M3 and thereby the PMOS transistor M5 always at on state. During the NMOSFET switch M2 is on, the enable signal EN2 maintains at high level for the NMOS transistor M4 and thereby the PMOS transistor M6 always at on state.

To turn on the NMOSFET switch M2 during the NMOSFET switch M1 is off, the OR gate 664 turns on the NMOS transistor M4 in response to the enable signal EN2, thereby turning on the PMOS transistor M6 by grounding its gate, such that the charge pump 62 charges the gate of the NMOSFET switch M2 to thereby turn on the NMOSFET switch M2. The hysteresis comparator 642 monitors the gate voltage VG1 of the NMOSFET switch M1 in such a manner that, if the gate voltage VG1 is lower than the level Vp1+Vth, the hysteresis comparator 642 produces comparison output to signal the OR gate 644 to turn on the NMOS transistor M3 by the signal V1, thereby grounding the gate of the PMOS transistor M5 to turn on the PMOS transistor M5, such that the charge pump 62 is coupled to the gate of the NMOSFET switch M1 to charge thereto. Once the gate voltage VG1 of the NMOSFET switch M1 reaches the level Vp1+Vth, the NMOS transistor M3 is turned off by the signal V1, and hence the PMOS transistor M5 is turned off too, thereby maintaining the gate voltage VG1 near the level Vp1+Vth but not enough to turn on the NMOSFET switch M1. To turn on the NMOSFET switch M1 and turn off the NMOSFET switch M2, the NMOS transistor M3 and the PMOS transistor M5 are turned on, and the NMOS transistor M4 and the PMOS transistor M6 are turned off, such that the charge pump 62 is coupled to the gate of the NMOSFET switch M1 to pump the gate voltage VG1 from the level Vp1+Vth. Since the time to pull high the gate voltage VG1 from zero to the level Vp1+Vth is saved, and the gate of the NMOSFET switch M2 shares the charges thereon with the gate of the NMOSFET switch M1 through the diode D2 and the PMOS transistor M5, it turns on the NMOSFET switch M1 much faster. The gate voltage VG2 of the NMOSFET switch M2 decays gradually, and once it is detected lower than the level Vp2+Vth by the hysteresis comparator 662, the OR gate 664 turns on the NMOS transistor M4 and thereby the PMOS transistor M6 by the signal V2, causing the charge pump 62 to charge the gate of the NMOSFET switch M2 so as to rise up the gate voltage VG2. Until the gate voltage VG2 reaches the level Vp2+Vth, the NMOS transistor M4 and the PMOS transistor M6 are turned off to maintain the gate voltage VG2 near the level Vp2+Vth.

To turn off the NMOSFET switch M1 and turn on the NMOSFET switch M2 again, the NMOS transistor M3 and the PMOS transistor M5 are turned off, and the NMOS transistor M4 and the PMOS transistor M6 are turned on, so as to couple the charge pump 62 to the gate of the NMOSFET switch M2 to pump the gate voltage VG2 from the level Vp2+Vth. Therefore, the time to pull high the gate voltage VG2 from zero to the level Vp2+Vth is saved, and the gate of the NMOSFET switch M1 shares the charges thereon with the gate of the NMOSFET switch M2 through the diode D1 and the PMOS transistor M6, causing the NMOSFET switch M2 to be turned on much faster. In other embodiments, it may only use either the blocks 64 and 66 or the blocks 65 and 67 for serving as the two quick turn on apparatus for the NMOSFET switches M1 and M2, respectively.

Since the NMOSFET switches M1 and M2 turn on quickly, the switching circuits 50 and 60 can achieve seamless transition.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A switching circuit comprising:
   a first input;
   a second input;
   an output;
   a first NMOSFET switch having a drain coupled to the first input and a source coupled to the output;
   a first quick turn on apparatus coupled to a gate of the first NMOSFET switch for maintaining a gate-to-source voltage of the first NMOSFET switch nonzero but not enough to turn on the first NMOSFET switch when the first NMOSFET switch is off;
   a second NMOSFET switch having a drain coupled to the second input and a source coupled to the output; and
   a second quick turn on apparatus coupled to a gate of the second NMOSFET switch for maintaining a gate-to-source voltage of the second NMOSFET switch nonzero but not enough to turn on the second NMOSFET switch when the second NMOSFET switch is off;
   a switch and a diode coupled in series between the gate of the first NMOSFET switch and the gate of the second NMOSFET switch;
   wherein the gate of the first NMOSFET switch shares charges thereon with the gate of the second NMOSFET switch through the switch and the diode when the first NMOSFET switch is off.

2. The switching circuit of claim 1, further comprising:
   a second switch and a second diode coupled in series between the gate of the first NMOSFET switch and the gate of the second NMOSFET switch;
   wherein the gate of the second NMOSFET switch shares charges thereon with the gate of the first NMOSFET switch through the second switch and the second diode when the second NMOSFET switch is off.

3. A switching circuit comprising:
   a first input;

a second input;

an output;

a first NMOSFET switch having a drain coupled to the first input and a source coupled to the output;

a first switch coupled to a gate of the first NMOSFET switch;

a first quick turn on apparatus for monitoring a gate voltage of the first NMOSFET switch when the first NMOSFET switch is off, so as to turn on the first switch for charging the gate of the first NMOSFET switch once the gate voltage of the first NMOSFET switch is lower than a first threshold;

a second NMOSFET switch having a drain coupled to the second input and a source coupled to the output;

a second switch coupled to a gate of the second NMOSFET switch;

a second quick turn on apparatus for monitoring a gate voltage of the second NMOSFET switch when the second NMOSFET switch is off, so as to turn on the second switch for charging the gate of the second NMOSFET switch once the gate voltage of the second NMOSFET switch is lower than a second threshold; and, a diode coupled between the gate of the first NMOSFET switch and the second switch, such that the gate of the first NMOSFET switch shares charges thereon with the gate of the second NMOSFET switch when the second switch is on.

4. The switching circuit of claim 3, further comprising a second diode coupled between the gate of the second NMOSFET switch and the first switch, such that the gate of the second NMOSFET switch shares charges thereon with the gate of the first NMOSFET switch when the first switch is on.

5. A switching circuit comprising:

a first input;

a second input;

an output;

a first NMOSFET switch having a drain coupled to the first input and a source coupled to the output;

a second NMOSFET switch having a drain coupled to the second input and a source coupled to the output;

a first quick turn on apparatus coupled between a gate of the first NMOSFET switch and a gate of the second NMOSFET switch, wherein when the second NMOSFET switch is off, the gate of the second NMOSFET switch shares charges thereon with the gate of the first NMOSFET switch through the first quick turn on apparatus to speed up the first NMOSFET switch to turn on; and a second quick turn on apparatus coupled between a gate of the first NMOSFET switch and a gate of the second NMOSFET switch, wherein when the first NMOSFET switch is off, the gate of the first NMOSFET switch shares charges thereon with the gate of the second NMOSFET switch through the second quick turn on apparatus to speed up the second NMOSFET switch to turn on.

6. The switching circuit of claim 5, wherein the first quick turn on apparatus comprises a switch and a diode coupled in series between the gate of the first NMOSFET switch and the gate of the second NMOSFET switch.

7. The switching circuit of claim 5, wherein the second quick turn on apparatus comprises a switch and a diode coupled in series between the gate of the first NMOSFET switch and the gate of the second NMOSFET switch.

8. A switching circuit comprising:

a first input;

a second input;

an output;

a first NMOSFET switch having a drain coupled to the first input and a source coupled to the output;

a first switch coupled to a gate of the first NMOSFET switch;

a second NMOSFET switch having a drain coupled to the second input and a source coupled to the output;

a second switch coupled to a gate of the second NMOSFET switch;

a first diode coupled between the gate of the second NMOSFET switch and the first switch such that when the first switch is on, the gate of the second NMOSFET switch shares charges thereon with the gate of the first NMOSFET switch to speed up the first NMOSFET switch to turn on; and a second diode coupled between the gate of the first NMOSFET switch and the second switch such that when the second switch is on, the gate of the first NMOSFET switch shares charges thereon with the gate of the second NMOSFET switch to speed up the second NMOSFET switch to turn on.

9. The switching circuit of claim 8, wherein the second switch is a MOS transistor.

10. The switching circuit of claim 9, wherein the first diode is a parasitic diode of the MOS transistor.

11. The switching circuit of claim 8, wherein the first switch is a MOS transistor.

12. The switching circuit of claim 11, wherein the second diode is a parasitic diode of the MOS transistor.

* * * * *